(12) United States Patent
Li et al.

(10) Patent No.: US 11,567,604 B2
(45) Date of Patent: Jan. 31, 2023

(54) DISPLAY MODULE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Feifan Li, Beijing (CN); Ajuan Du, Beijing (CN); Liang Gao, Beijing (CN); Xiaoxia Huang, Beijing (CN); Hao Sun, Beijing (CN); Bin Wang, Beijing (CN); Dong Wang, Beijing (CN); Enjian Yang, Beijing (CN); Hufei Yang, Beijing (CN); Shuang Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/505,718

(22) Filed: Oct. 20, 2021

(65) Prior Publication Data
US 2022/0121311 A1 Apr. 21, 2022

(30) Foreign Application Priority Data
Oct. 21, 2020 (CN) .......................... 202022362167.6

(51) Int. Cl.
*G06F 3/041* (2006.01)

(52) U.S. Cl.
CPC .. *G06F 3/0416* (2013.01); *G06F 2203/04102* (2013.01); *G06F 2203/04107* (2013.01)

(58) Field of Classification Search
CPC ...... G06F 3/041; G06F 3/0412; G06F 3/0416; G06F 2203/04102; G06F 2203/04107; G09G 2300/0408; G09G 2300/0426; G09G 2330/045; G09G 2330/06; G09G 3/3233; H05K 1/147; H05K 1/0215; H05K 1/189; H05K 3/281; H05K 3/284; H05K 2201/0715; H05K 2201/10371; H01L 27/323; H01L 27/3246; H01L 27/32
See application file for complete search history.

(56) References Cited

U.S. PATENT DOCUMENTS 10,593,899 B2 * 3/2020 Jung .................. H01L 51/5237
2014/0246687 A1 * 9/2014 Ha ......................... G06F 1/1643
257/668
2019/0312090 A1 * 10/2019 Park ....................... G06F 1/1626
2020/0196496 A1 * 6/2020 Shin ......................... H05K 5/03
(Continued)

*Primary Examiner* — Ryan A Lubit
(74) *Attorney, Agent, or Firm* — Dority & Manning, P.A.

(57) ABSTRACT

A display module includes a display panel, a flexible circuit board, a driving control chip, a touch control chip and a protective structure. The flexible circuit board is bonded to the display panel. The driving control chip is located on the display panel or the flexible circuit board. The touch control chip is located on the flexible circuit board or the display panel. The protective structure covers the driving control chip and/or the touch control chip. And the protective structure includes a first insulating layer, a heat dissipation layer and an electromagnetic shielding layer that are sequentially disposed away from the display panel.

17 Claims, 5 Drawing Sheets

(56) References Cited

U.S. PATENT DOCUMENTS

2020/0201482 A1* 6/2020 Weisse ................ G06F 3/04164
2020/0264668 A1* 8/2020 Baek ..................... G06F 1/203
2020/0356217 A1* 11/2020 Jeong ................... G06F 3/0448

* cited by examiner

DISPLAY MODULE AND DISPLAY DEVICE

CROSS-REFERENCE TO RELATED APPLICATIONS

This application claims priority to Chinese Patent Application No. 202022362167.6, filed on Oct. 21, 2020, which is incorporated herein by reference in its entirety.

TECHNICAL FIELD

The present disclosure relates to the field of display technologies, and in particular, to a display module and a display device.

BACKGROUND

An organic light-emitting diode (OLED) has advantages of self-luminescence, low energy consumption, lightness and thinness, high color saturation, etc., and may be manufactured into a flexible display device based on a flexible material. The OLED is widely applied to various electronic devices including a computer, a mobile phone and the like.

SUMMARY

In an aspect, a display module is provided. The display module includes a display panel, a flexible circuit board, a driving control chip, a touch control chip and a protective structure. The flexible circuit board is bonded to the display panel. The driving control chip is located on the display panel or the flexible circuit board. The touch control chip is located on the flexible circuit board or the display panel. The protective structure covers the driving control chip and/or the touch control chip. And the protective structure includes a first insulating layer, a heat dissipation layer and an electromagnetic shielding layer that are sequentially disposed away from the display panel.

In some embodiments, the protective structure further includes: a wave-absorbing material layer located between the first insulating layer and the heat dissipation layer, the wave-absorbing material layer at least covering the driving control chip and/or the touch control chip; and a second insulating layer located between the wave-absorbing material layer and the heat dissipation layer.

In some embodiments, an edge of the second insulating layer is connected to an edge of the first insulating layer, so that the wave-absorbing material layer is sealed between the first insulating layer and the second insulating layer.

In some embodiments, the flexible circuit board includes a first conductive portion, and the electromagnetic shielding layer is electrically connected to the first conductive portion so that the electromagnetic shielding layer is grounded.

In some embodiments, the electromagnetic shielding layer is electrically connected to the first conductive portion through a first conductive adhesive, so that the electromagnetic shielding layer is grounded.

In some embodiments, the protective structure includes a whole protective structure covering the driving control chip and the touch control chip.

In some embodiments, the whole protective structure further covers circuits located between the driving control chip and the touch control chip.

In some embodiments, the protective structure includes two protective sub-structures, one protective sub-structure covers the driving control chip, and another protective sub-structure covers the touch control chip.

In some embodiments, the two protective sub-structures share the first insulating layer and the electromagnetic shielding layer.

In some embodiments, the display panel is a flexible display panel, the flexible display panel includes a display region and a peripheral region connected to at least one side of the display region. The peripheral region is bent to a non-display side of the display region. The flexible circuit board is located on the non-display side of the display region, and bonded to the peripheral region. The touch control chip is located on a surface of the flexible circuit board away from the display region. The driving control chip is located on a surface of the peripheral region away from the display region.

In some embodiments, the display module further includes at least one connecting portion located between the display region and the flexible circuit board. The at least one connecting portion is configured to fix the flexible circuit board on the display region.

In some embodiments, the display module further includes a protective backing plate located between the display region and the peripheral region.

In some embodiments, the display module further includes an electrostatic protective layer located on the non-display side of the display panel. The flexible circuit board further includes a second conductive portion. The electrostatic protective layer is electrically connected to the second conductive portion so that the electrostatic protective layer is grounded. The at least one connecting portion is located on a side of the electrostatic protective layer away from the display panel. The second conductive portion is located on a periphery of the at least one connecting portion.

In some embodiments, the electrostatic protective layer is electrically connected to the second conductive portion through a second conductive adhesive, so that the electrostatic protective layer is grounded.

In some embodiments, the electrostatic protective layer includes a mesh adhesive layer, a foam layer and a copper layer that are sequentially disposed away from the display panel. The copper layer is electrically connected to the second conductive portion.

In some embodiments, the heat dissipation layer includes a nano-carbon layer, and/or the electromagnetic shielding layer includes a copper foil layer.

In some embodiments, the wave-absorbing material layer includes ferrite or a magnetic iron nanomaterial.

In another aspect, a display device is provided. The display device includes the display module as described in the above, and a protective cover plate disposed on a display side of the display module.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition; the accompanying drawings to be described below may be regarded as schematic diagrams, and are not limitations on actual sizes of products; actual processes of methods and actual timings of signals to which the embodiments of the present disclosure relate.

DETAILED DESCRIPTION

Figure 1:
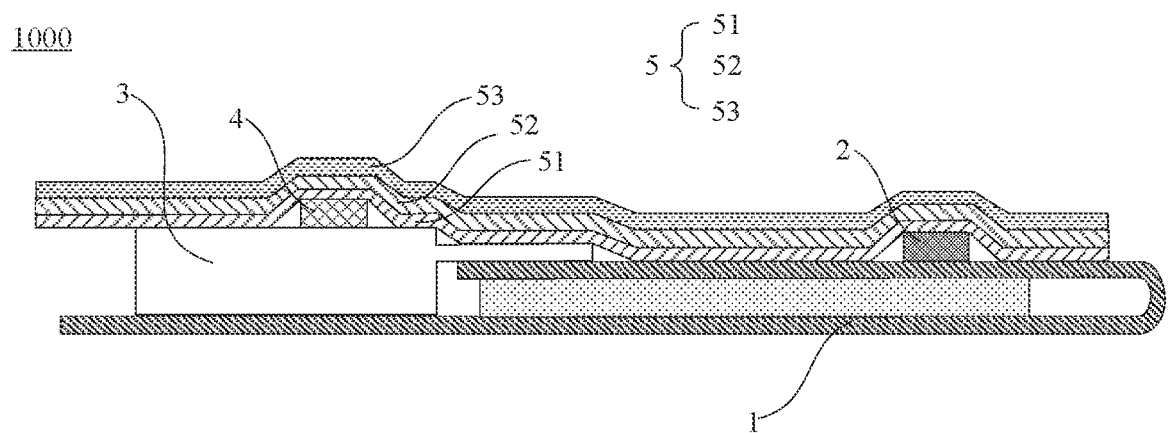
FIG. 1 is a diagram showing a structure of a display module, in accordance with some embodiments.

Technical solutions in some embodiments of the present disclosure will be described clearly and completely below with reference to accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to," In the description, the terms such as "one embodiment", "some embodiments", "exemplary embodiments", "example", "specific example" or "some examples," are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first" and "second" are only used for descriptive purposes, and are not to be construed as indicating or implying the relative importance or implicitly indicating the number of indicated technical features. Thus, features defined as "first" or "second" may explicitly or implicitly include one or more of the features. In the description of the embodiments of the present disclosure, the term "a plurality of" means two or more unless otherwise specified.

In the description of some embodiments, the term "coupled" and "connected" and their extensions may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "A and/or B" includes the following three combinations: only A, only B, and a combination of A and B.

The use of "adapted to" or "configured to" herein implies an open and inclusive expression that does not exclude devices adapted to or configured to perform additional tasks or steps.

The term "about", "substantially" and "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

Exemplary embodiments are described herein with reference to sectional views and/or plan views that are schematic illustrations of idealized embodiments. In the drawings, thicknesses of layers and regions may be enlarged for clarity. Therefore, variations in a shape with respect to the drawings due to, for example, manufacturing technology and/or tolerances may be envisaged, Therefore, exemplary embodiments should not be construed as being limited to the shapes of the regions as illustrated herein, but include deviations in shapes due to, for example, manufacturing. For example, an etched region shown as a rectangle will generally have curved features. Therefore, the regions shown in the drawings are schematic in nature, and their shapes are not intended to show the actual shapes of the regions of the device, and are not intended to limit the scope of the exemplary embodiments.

Figure 8:
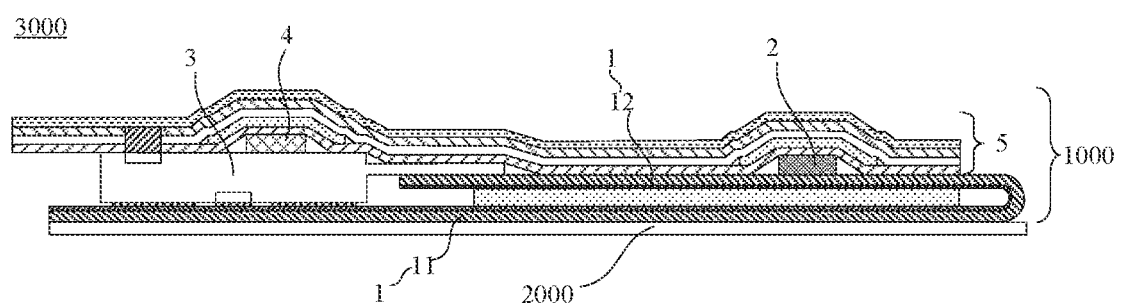
FIG. 8 is a diagram showing a structure of a display device, in accordance with some embodiments.

Some embodiments of the present disclosure provide a display device 3000. As shown in FIG. 8, the display device 3000 includes a display module 1000 and a protective cover plate 2000, and the protective cover plate 2000 is located on a display side of the display module 1000. The protective cover plate 2000 is configured to protect the display module 1000, so as to prevent the display module 1000 from failing to normally display due to the display device 3000 being scratched or squeezed.

The display device 3000 may be any component having a display function, such as a watch, a tablet computer, a notebook computer, a display, a television, a billboard, a digital photo frame, a printer, a telephone, a mobile phone, a personal digital assistant (FDA), a digital camera, a camcorder, a viewfinder, a navigator, a household appliance, and an information search device (e.g., a business search device of a department of, such as, an electronic government, a bank, a hospital, an electric power, or a post office).

Figure 9A:
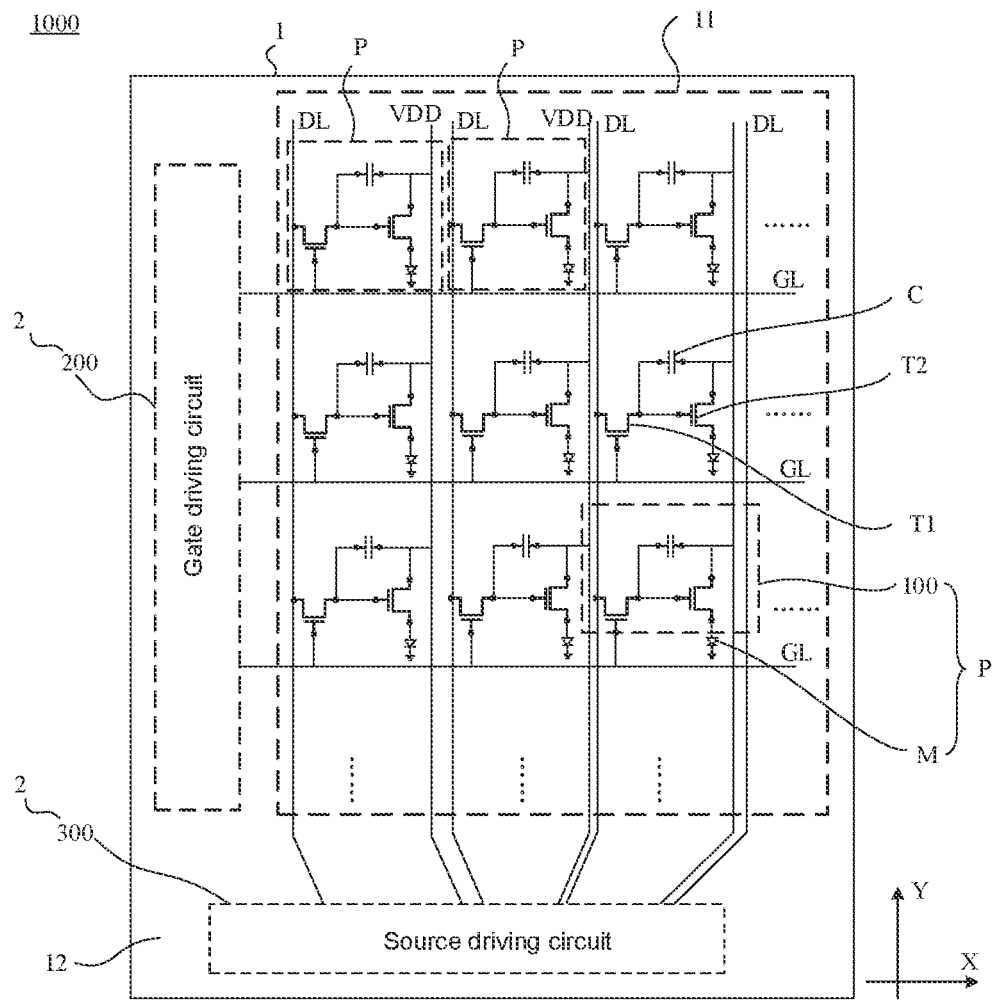
FIG. 9A is a diagram showing a structure of yet another display module, in accordance with some embodiments.

As shown in FIG. 1, the display module 1000 includes a display panel 1. The display panel 1 is used for displaying an image, and may be an organic light emitting diode (OLED) display panel. As shown in FIG. 9A, the display panel 1 includes a display region 11 and a peripheral region 12 located on at least one side of the display region 11, The display region 11 includes a plurality of sub-pixels P defined by gate lines GL and data lines DL. For convenience of description, a description will be made below by taking an example in which the plurality of sub-pixels P are arranged in a matrix. Sub-pixels P arranged in a row in a horizontal direction X are referred to as a same row of sub-pixels, and sub-pixels P arranged in a row in the vertical direction Y are referred to as a same column of sub-pixels. Each sub-pixel P includes a pixel circuit 100 and a light emitting device M electrically connected to the pixel circuit 100. The pixel circuit 100 is able to drive the light emitting device M electrically connected thereto to emit light.

As shown in FIG. 8, the display module 1000 further includes at least one driving control chip 2 and a flexible circuit board 3. The number of driving control chips is not limited in some embodiments of the present disclosure, and it may be one, two, three or more.

The flexible circuit board 3 is bonded to the peripheral region 12 of the display panel 1. The driving control chip 2 is disposed in the peripheral region 12 or on the flexible circuit board 3, electrically connected to the pixel circuit 100, and configured to provide a driving signal to the pixel circuit 100. The driving control chip 2 is disposed in the peripheral region 12, which makes a distance between the driving control chip 2 and the pixel circuit 100 short, thereby reducing a loss of a signal transmitted between the driving control chip 2 and the pixel circuit 100 in a transmission process. It is conducive to ensure a normal display of the display module 1000.

For example, as shown in FIG. 9A, the display module 1000 includes two driving control chips 2, i.e., a gate driving circuit 200 and a source driving circuit 300. The gate driving circuit 200 and the source driving circuit 300 are disposed in the peripheral region 12 of the display panel 1. FIG. 9A illustrates the gate driving circuit 200 located on a left side of the display region 11, and the source driving circuit 300 located on a lower side of the display region 11. The gate driving circuit 200 is configured to provide gate driving signals for progressive scanning to the gate lines GL. The source driving circuit 300 is configured to provide data signals to the data lines DL, and provide a voltage signal to common power lines VDD. In this way, the pixel circuit 100 drives the light emitting device M electrically connected thereto to emit light under action of the gate driving signals, the data signals and the voltage signal.

Figure 9B:
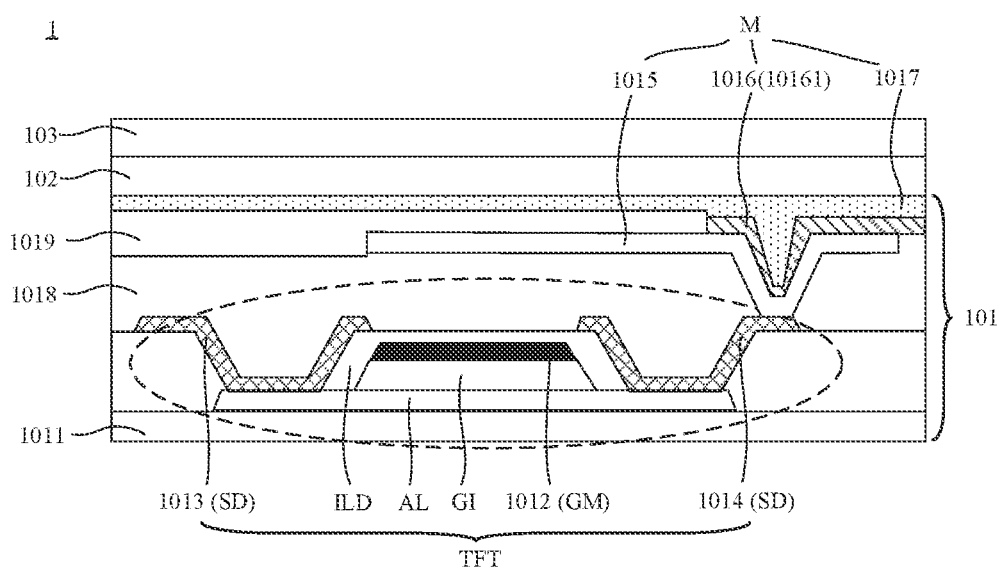
FIG. 9B is a sectional view of a display panel, in accordance with some embodiments.
Figure 9C:
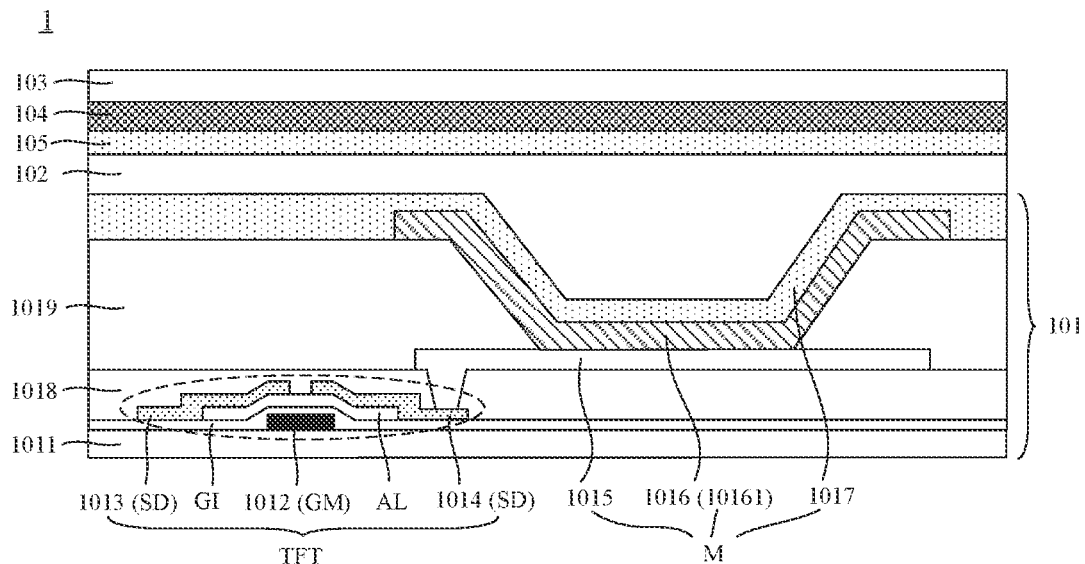
FIG. 9C is a sectional view of another display panel, in accordance with some embodiments.

As shown in FIGS. 9B and 9C, the display panel 1 includes a display substrate 101 having a plurality of pattern layers stacked, an encapsulation layer 102, and a touch structure 103. The encapsulation layer 102 is used to prevent moisture and oxygen from entering the display substrate 101, thereby preventing a poor display and other phenomena.

As shown in FIG. 9B, the touch structure 103 is directly disposed on the encapsulation layer 102, i.e., no other film layer is disposed between the touch structure 103 and the encapsulation layer 102. In some other embodiments, as shown in FIG. 9C, the touch structure 103 is disposed on a substrate 104, and the substrate 104 is attached to the encapsulation layer 102 through an optical adhesive 105. A material of the substrate 104 may be, for example, polyethylene terephthalate (PET), polyimide (PI), cyclic olefin polymer (COP).

The display substrate 101 includes a base 1011. The gate lines GL, the data lines DL, the common power lines VDD, the pixel circuits 100, the light emitting devices M, the gate driving circuit 200 and the source driving circuit 300 are all disposed on the base 1011.

The base 1011 may be a flexible base. The flexible base 1011 may be made of one or more of polyimide (PI), polyethylene terephthalate (PET), polyethylene naphthalate two formic acid glycol ester (PEN), and the like.

The gate lines GL are insulated from and intersect with the data lines DL, and the common power lines VDD may be parallel to the data lines DL.

As shown in FIGS. 9A to 9C, the pixel circuit 100 includes at least one thin film transistor TFT and at least one capacitor C. Each thin film transistor TFT may have a top-gate or bottom-gate structure. As shown in FIG. 9B, the thin film transistor TFT having the top-gate structure includes an active layer AL, a gate insulating layer GI, a gate metal pattern layer GM (which is used for forming a gate 1012), an interlayer dielectric layer ILD and a source-drain metal pattern layer SD (which is used for forming a source electrode 1013 and a drain 1014) that are disposed on a side of the base 1011. In some other embodiments, as shown in FIG. 9C, the thin film transistor TFT having the bottom-gate structure includes a gate metal pattern layer GM (which is used for forming a gate 1012), a gate insulating layer GI, an active layer AL, and a source-drain metal pattern layer SD (which is used for forming a source electrode 1013 and a drain 1014) that are disposed on a side of the base 1011.

There are various types of thin film transistors TFTs. For example, the thin film transistor TFT may be an N-type thin film transistor or a P-type thin film transistor, and their difference only lies in a turn-on condition. The N-type thin film transistor is turned on at a high level, and turned off at a low level. The P-type thin film transistor is turned on at the low level, and turned off at the high level. The active layer AL of the thin film transistor TFT may be composed of amorphous silicon, single crystal silicon, polycrystalline silicon, or an oxide semiconductor. The active layer AL includes a channel region not doped with an impurity, and a source region and a drain region that are formed by doping an impurity on both sides of the channel region. The impurity to be doped varies with the type of the thin film transistor TFT, and may be an N-type impurity or a P-type impurity.

The capacitor C includes a first electrode plate and a second electrode plate, and an interlayer insulating film as a dielectric is disposed between the two electrode plates.

Figure 9D:
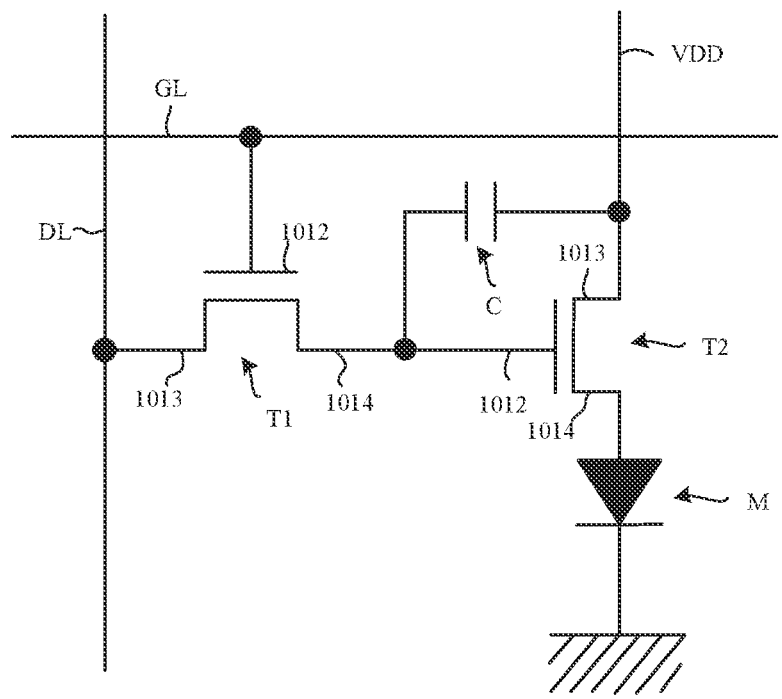
FIG. 9D is a diagram showing a structure of a pixel circuit; in accordance with some embodiments.

FIG. 9D illustrates an electrical connection relationships inside and outside the pixel circuit by taking an example in which the pixel circuit 100 with a 2T1C structure includes two thin film transistors TFT (i.e., a switching thin film transistor T1 and a driving thin film transistor T2) and one capacitor C. FIGS. 9B and 9C only show structures and connection relationships of the driving thin film transistor (such as structures in the dash lines of FIGS. 9B and 9C) and the light emitting device M. However, a structure of the switching transistor and its connection relationship with other components may be well determined by those skilled in the art according to the context.

As shown in FIG. 9D, a gate 1012 of the switching thin film transistor T1 is connected to the gate line GL, a source 1013 of the switching thin film transistor T1 is connected to the data line DL, and a drain 1014 of the switching thin film transistor T1 is connected to a gate 1012 of the driving thin film transistor T2. A source 1013 of the driving thin film transistor T2 is connected to the common power line VDD, and a drain 1014 of the driving thin film transistor T2 is connected to a first electrode 1015 of the light emitting device M through a via hole. The first electrode plate of the capacitor C is connected to the gate 1012 of the driving thin film transistor T2, and the second electrode plate of the capacitor C is connected to the source 1013 of the driving thin film transistor T2.

The switching thin film transistor T1 is turned on by a gate voltage applied to the gate line GL, thereby transmitting a data voltage applied to the data line DL to the driving thin film transistor T2. There is a certain difference between a data voltage transmitted from the switching thin film transistor T1 to the driving thin film transistor T2 and a common voltage applied from the common power line VDD to the driving thin film transistor T2. A voltage corresponding to an absolute value of the difference is stored in the capacitor C. A current corresponding to the voltage stored in the capacitor C flows into the light emitting device M through the driving thin film transistor T2, so that the light emitting device M emits light.

In addition, as shown in FIGS. 9B and 9C, the light emitting device M includes a first electrode 1015, a light emitting functional layer 1016 and a second electrode 1017. One of the first electrode 1015 and the second electrode 1017 is an anode (which is used for supplying holes), and another is a cathode (which is used for supplying electrons). The first electrode 1015 and the second electrode 1017 inject holes and electrons into the light emitting functional layer 1016. When an exciton generated by a combination of the hole and the electron transitions from an excited state to a ground state, light is formed.

The first electrode 1015 may be formed of a metal with high reflectivity, and the second electrode 1017 may be formed of a transparent conductive film. In this case, light from the light emitting functional layer 1016 is reflected by the first electrode 1015, and directed to the outside through the second electrode 1017, thereby forming a top-emission type light emitting device. However, embodiments of the present disclosure are not limited thereto. In a case where the first electrode 1015 is formed of the transparent conductive film and the second electrode 1017 is formed of the metal with the high reflectivity, a bottom-emission type light emitting device may be formed. Of course, in a case where both the first electrode 1015 and the second electrode 1016 are formed of the transparent conductive film, a dual-side-emission type light emitting device may be formed.

A material of the transparent conductive film may be, for example, metal oxide such as indium tin oxide (ITO), indium zinc oxide (CO), or indium gallium zinc oxide (IGZO). The metal with the high reflectance may be, for example, an alloy such as magnesium aluminum alloy (MgAl) or lithium aluminum alloy (LiAl), or a metal element such as magnesium (Mg), aluminum (Al), lithium (Li), or silver (Ag).

In some embodiments, as shown in FIGS. 9B and 9C, the light emitting functional layer 1016 may include a light emitting layer 10161. In some other embodiments, the light emitting function layer 1016 may include at least one of a hole injection layer (HIL), a hole transport layer (HTL), an electron transport layer (ETL) or an electron injection layer (EIL) (not shown in FIGS. 9B and 9O) in addition to the light emitting layer 10161. In a case where the light emitting functional layer 1016 includes all of the above layers, the HIL, the HTL, the light emitting layer 10161, the ETL and the EIL are sequentially stacked on the first electrode 1015 as the anode.

As shown in FIGS. 9B and 9C, the display substrate 101 may further include a planarization layer 1018 disposed between the thin film transistor TFT and the first electrode 1015, and a pixel defining layer 1019 disposed on a side of the planarization layer 1018 away from the base 1011. The pixel defining layer 1019 includes a plurality of opening regions, and barrier walls disposed around the opening regions, A light emitting device M is disposed in an opening region. First electrodes 1015 and light emitting layers 10161 of adjacent light emitting devices M are separated by a barrier wall of a pixel defining layer 1019. Second electrodes 1017 of the light emitting devices M are connected as a whole, that is, the second electrodes 1017 are a whole layer. The HIL, the HTL, the ETL, the EIL, and the like in the light emitting functional layer 1016 may be separated by barrier walls of the pixel defining layer 1019, or may be whole layers. A material of the pixel defining layer 1019 is, for example, black polyimide, which is able to absorb light that is emitted by one light emitting device M and directed to another adjacent light emitting device M so as to prevent light mixing between two adjacent sub-pixels.

The encapsulation layer 102 may be an encapsulation film. The number of layers of the encapsulation films included in the encapsulation layer 102 is not limited. In some embodiments, the encapsulation layer 102 may include one layer of encapsulation film, or may include two or more layers of encapsulation films that are stacked. For example, the encapsulation layer 102 includes three layers of encapsulation films that are sequentially stacked.

In a case where the encapsulation layer 102 includes the three layers of encapsulation films that are sequentially stacked, a material of the encapsulation film located in a middle layer is an organic material, and materials of the encapsulation films located on both sides are an inorganic material. The organic material may be, for example, polymethyl methacrylate (PMMA). The inorganic material may be one or more of silicon nitride ($SiN_x$), silicon oxide ($SiO_x$), or silicon oxynitride ($SiO_xN_y$).

As shown in FIG. 8, the display module 1000 further includes a touch control chip 4. The touch control chip 4 is disposed on the flexible circuit board 3 or the peripheral region 12 of the display panel 1. The touch control chip 4 is electrically connected to a touch structure 103, and configured to provide a driving signal to the touch structure 103.

Figure 5:
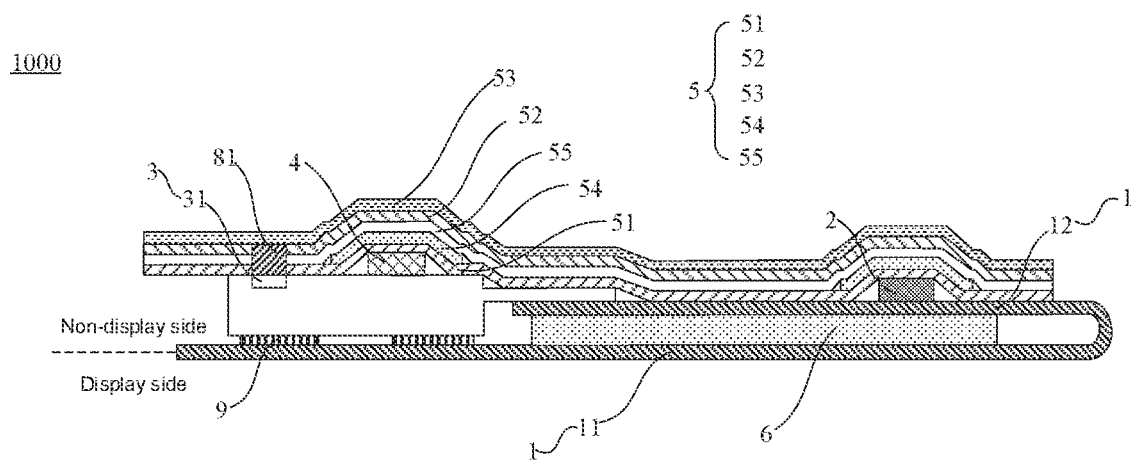
FIG. 5 is a diagram showing a structure of yet another display module, in accordance with some embodiments.

In some embodiments, as shown in FIG. 5, the peripheral region 12 is bent to a non-display side of the display region 11. On this basis, the flexible circuit board 3 is located on the non-display side of the display region 11, the driving control chip 2 is located on a surface of the peripheral region 12 away from the display region 11, and the touch control chip 4 is located on a surface of the flexible circuit board 3 away from the display region 11. The peripheral region 12 is bent to the non-display side of the display region 11 to reduce a width of a bezel of the display device 3000 including the display panel 1, so that the display device 3000 may realize a narrow bezel design.

The display module 1000 further includes a protective structure 5. The protective structure 5 covers the driving control chip 2 and/or the touch control chip 4. The protective structure 5 includes a first insulating layer 51, a heat dissipation layer 52 and an electromagnetic shielding layer 53 that are sequentially disposed away from the driving control chip 2 and/or the touch control chip 4. For example, the protective structure 5 may cover only the driving control chip 2, only the touch control chip 4, or both the driving control chip 2 and the touch control chip 4 (as shown in FIG. 1).

It will be noted that, in some embodiments of the present disclosure, the protective structure 5 may cover not only the driving control chip 2 and the touch control chip 4, but also the flexible circuit board 3 and other circuits around the driving control chip 2 and the touch control chip 4 on the display panel 1, so as to protect the other circuits around the driving control chip 2 and the touch control chip 4.

The first insulating layer 51 has an insulating property. Therefore, the first insulating layer 51 is able to protect the driving control chip 2 and/or the touch control chip 4 that are covered by the first insulating layer 51 from static electricity, so as to prevent the driving control chip 2 and/or the touch control chip 4 from being interfered by the static electricity.

For example, the first insulating layer 51 may be an adhesive layer with adhesiveness. The first insulating layer 51 is disposed between the driving control chip 2 and/or the touch control chip 4, and the heat dissipation layer 52. As a result, the heat dissipation layer 52 can be bonded to the surfaces of the driving control chip 2 and/or the touch control chip 4 away from the display panel 1, and the heat dissipation layer 52 can be insulated from the driving control chip 2 and the touch control chip 4.

For example, the heat dissipation layer 52 may include a nanocarbon layer. That is, a material of the heat dissipation layer 52 may include nanocarbon. The nanocarbon has an excellent heat conduction performance, and thus may quickly conduct heat away from a region where the driving control chip 2 and/or the touch control chip 4 are located.

For example, the electromagnetic shielding layer 53 may include a copper foil layer. That is, a material of the electromagnetic shielding layer 53 may include copper foil. The copper foil has excellent interlayer heat conduction performance, and thus may quickly absorb and dissipate the heat conducted by the heat dissipation layer 52. Moreover, since cost of the copper foil is lower, cost of the protective structure 5 may be reduced by using the copper foil.

It will be understood that, since both the nanocarbon layer and the copper foil layer are conductive layers, the nanocarbon layer can also reflect electromagnetic waves. As a result, the ability of the protective structure 5 to electromagnetically shield the driving control chip 2 and/or the touch control chip 4 may be improved.

In some embodiments of the present disclosure, the protective structure 5 covering the driving control chip 2 and/or the touch control chip 4 are provided with a multi-layer structure that is composed of the first insulating layer 51, the heat dissipation layer 52 and the electromagnetic shielding layer 53. Therefore, the protective structure 5 has a good heat dissipation effect. When power and heat of the driving control chip 2 and/or the touch control chip 4 increase, the protective structure 5 dissipates heat well in a region of the display module 1000 where the driving control chip 2 and/or the touch control chip 4 are disposed by using the heat dissipation layer 52. As a result, a situation that the display device 3000 including the display module 1000 cannot be used normally due to excessively high temperature of the region where the driving control chip 2 and/or the touch control chip 4 are disposed may be avoided.

Figure 2:
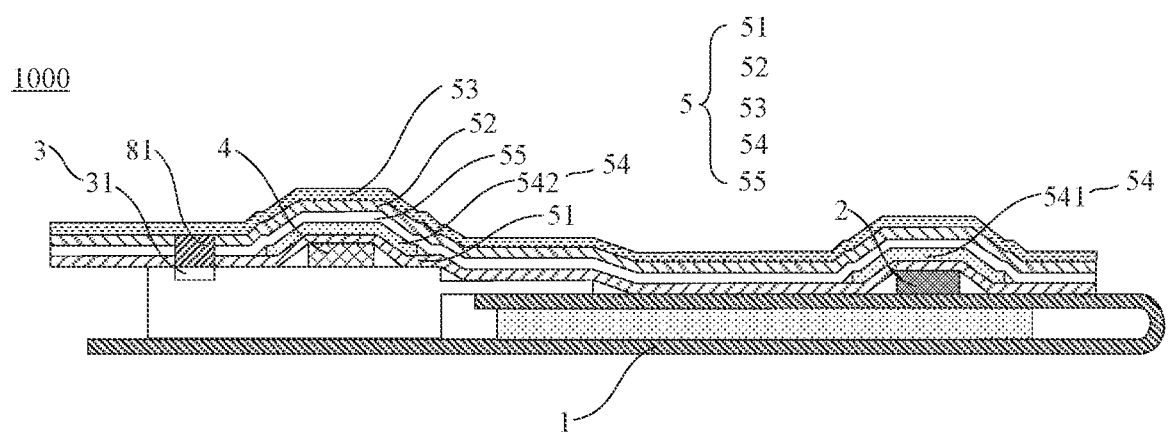
FIG. 2 is a diagram showing a structure of another display module, in accordance with some embodiments.

In some embodiments, as shown in FIG. 2, the protective structure 5 further includes a wave-absorbing material layer 54 and a second insulating layer 55. The wave-absorbing material layer 54 and the second insulating layer 55 at least cover the driving control chip 2 and/or the touch control chip 4. The wave-absorbing material layer 54 is located between the first insulating layer 51 and the heat dissipation layer 52, and the second insulating layer 55 is located between the wave-absorbing material layer 54 and the heat dissipation layer 52.

With such an arrangement, when the power of the driving control chip 2 increases and the number of electromagnetic waves emitted by the driving control chip 2 increases, the wave-absorbing material layer 54 may absorb the electromagnetic waves emitted by the driving control chip 2. As a result, the electromagnetic waves emitted by the driving control chip 2 is prevented from affecting circuits (e.g., a circuit on the flexible circuit board 3) at other positions of the display device 3000.

Similarly, when the power of the touch control chip 4 increases and the number of electromagnetic waves emitted by the touch control chip 4 increases, the wave-absorbing material layer 54 may also absorb the electromagnetic waves emitted by the touch control chip 4 that is covered by the wave-absorbing material layer 54. As a result, the electromagnetic waves emitted by the touch control chip 4 is prevented from affecting a circuit (for example, a circuit on the display panel 1 or a circuit on the flexible circuit board 3) around the touch control chip 4.

The second insulating layer 55 has an insulating property. Therefore, the second insulating layer 55 is also able to protect the driving control chip 2 and/or the touch control chip 4 that are covered by the second insulating layer 55 from static electricity, so as to prevent the driving control chip 2 and/or the touch control chip 4 from being interfered by the static electricity.

For example, the second insulating layer 55 may be an adhesive layer with adhesiveness. The second insulating layer 55 is disposed between the wave-absorbing material layer 54 and the heat dissipation layer 52. As a result, the heat dissipation layer 52 can be bonded to a surface of the wave-absorbing material layer 54 away from the first insulating layer 51, and the wave-absorbing material layer 54 can be insulated from the heat dissipation layer 52.

For example, a material of the wave-absorbing material layer 54 may include ferrite or magnetic iron nanomaterial.

It will be noted that, in a case where the wave-absorbing material layer 54 covers both the driving control chip 2 and the touch control chip 4, the wave-absorbing material layer 54 may be a whole layer. In this case, the wave-absorbing material layer 54 may also cover other circuits around the driving control chip 2 and the touch control chip 4.

In a case where the wave-absorbing material layer 54 covers both the driving control chip 2 and the touch control chip 4, the wave-absorbing material layer 54 may includes two wave-absorbing material sub-layers 541 and 542. As shown in FIG. 2, one wave-absorbing material sub-layer 541 covers the driving control chip 2, and another wave-absorbing material sub-layer 542 covers the touch control chip 4. In this case, the wave-absorbing material layer 54 may no longer cover the other circuits around the driving control chip 2 and the touch control chip 4, so as to reduce an area of the wave-absorbing material layer 54 and reduce manufacturing cost of the protective structure 5.

In some embodiments, as shown in FIG. 2, an edge of the second insulating layer 55 is connected to an edge of the first insulating layer 51, so that the wave-absorbing material layer 54 is sealed between the first insulating layer 51 and the second insulating layer 55. With such an arrangement, particles generated by the wave-absorbing material layer 54 may be prevented from entering other regions of display module 1000. In this way, the particles generated by the wave-absorbing material layer 54 are prevented from damaging structures of the other regions of display module 1000, and short circuit is prevented from occurring in part of the circuits due to the particles generated by the wave-absorbing material layer 54 entering a circuit structure region.

In some embodiments, as shown in FIG. 2, the flexible circuit board 3 includes a first conductive portion 31. The electromagnetic shielding layer 53 is electrically connected to the first conductive portion 31, so that the electromagnetic shielding layer 53 is grounded.

For example, the electromagnetic shielding layer 53 may be connected to the first conductive portion 31 through a first conductive adhesive 81, so that the electromagnetic shielding layer 53 is grounded. The electromagnetic shielding layer 53 is connected to the first conductive portion 31, and thus connected to a ground terminal of the flexible circuit board 3, thereby improving an antistatic capability of the display module 1000.

In some embodiments, as shown in FIGS. 1 and 2, the protective structure 5 may cover both the driving control chip 2 and the touch control chip 4. Therefore, the protective structure 5 may be directly manufactured on the driving control chip 2 and the touch control chip 4, and a manufacturing process of the protective structure 5 is simple and is easy to operate.

Figure 3:
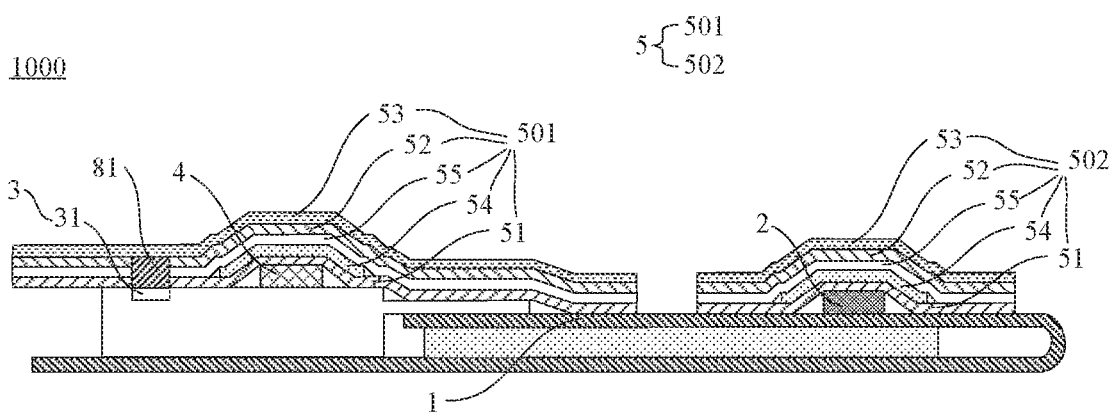
FIG. 3 is a diagram showing a structure of yet another display module, in accordance with some embodiments.

In some other embodiments, as shown in FIG. 3, the protective structure 5 includes two protective sub-structures 501 and 502. One protective sub-structure 501 covers the driving control chip 2, and another protective sub-structure 502 covers the touch control chip 4. In this way, an area covered by the protective structure 5 is small, thereby reducing manufacturing cost of the protective structure 5 and the display module 1000.

Figure 4:
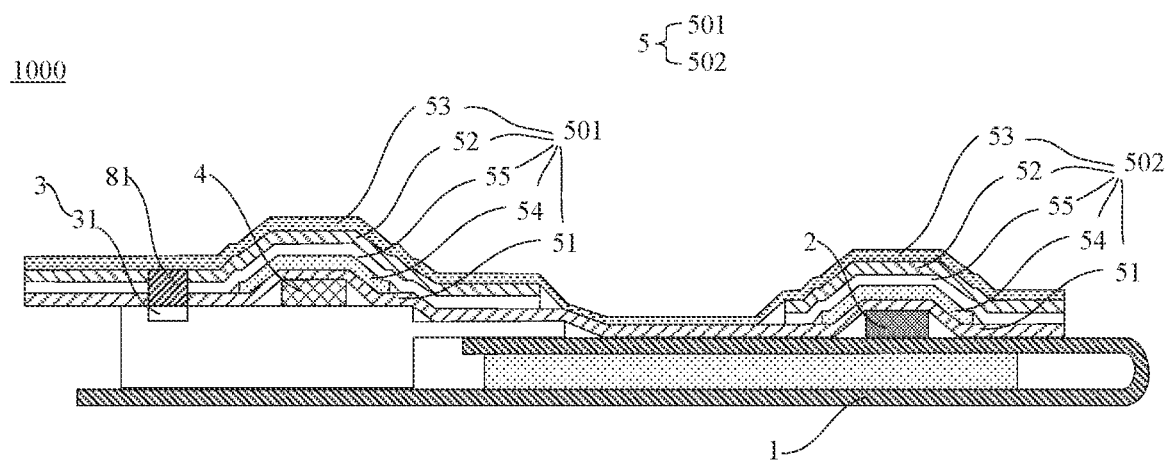
FIG. 4 is a diagram showing a structure of yet another display module, in accordance with some embodiments.

In yet some other embodiments, as shown in FIG. 4, in a case where the protective structure 5 includes two protective sub-structures 501 and 502, the two protective sub-structures 501 and 502 may share one electromagnetic shielding layer 53 and one first insulating layer 51. That is, the first insulating layer 51 and the electromagnetic shielding layer 52 may cover the driving control chip 2 and the touch control chip 4, and other circuit structures that are located between the driving control chip 2 and the touch control chip 4. In this way, the electromagnetic shielding layer 53 and the first insulating layer 51 may also provide electromagnetic shielding protection for the other circuit structures between the driving control chip 2 and the touch control chip 4.

In some embodiments, as shown in FIG. 5, the display module 1000 further includes at least one connecting portion 9. The connecting portion 9 is located between the display region 11 and the flexible circuit board 3, and configured to fix the flexible circuit board 3 on the display region 11. The flexible circuit board 3 is fixed on the display region 11 of the display panel 1, so as to prevent a position of the flexible circuit board 3 from moving during operation of the display module 1000, and thus prevent the circuit structure on the flexible circuit board 3 from being damaged. In this way, the normal display of the display module 1000 may be ensured.

In some embodiments, as shown in FIG. 5, the display module 1000 further includes a protective backing plate 6, and the protective backing plate 6 is located between the display region 11 and the peripheral region 12. With such a design, the protective backing plate 6 may support the peripheral region 12 that is bent to the non-display side of the display region 11, thereby preventing damage to components and film layer breakage in the display panel 1 caused by excessive bending of the peripheral region 12.

Figure 6:
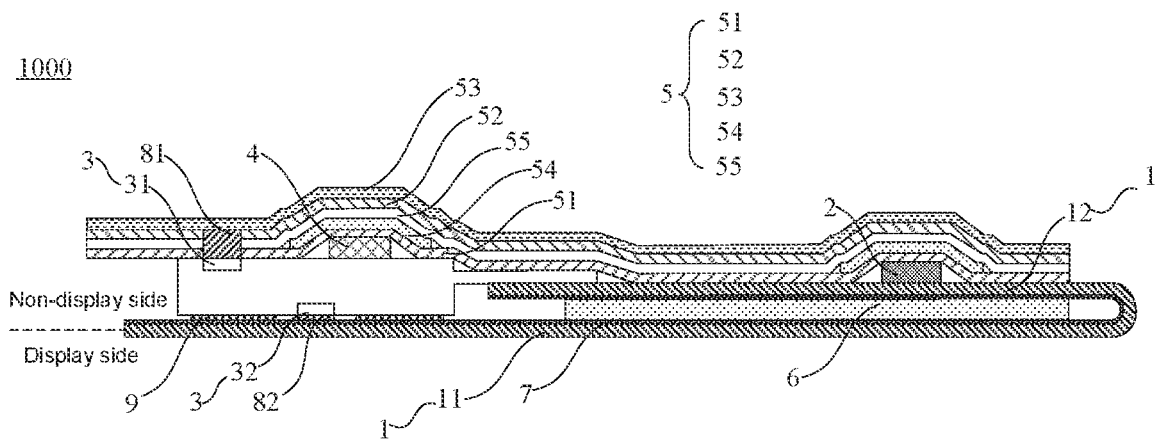
FIG. 6 is a diagram showing a structure of yet another display module, in accordance with some embodiments.

In some embodiments, as shown in FIG. 6, the display module 1000 further includes an electrostatic protective layer 7, and the electrostatic protective layer 7 is located on a back surface (a non-display side) of the display panel 1. The flexible circuit board 3 further includes a second conductive portion 32. The electrostatic protective layer 7 is electrically connected to the second conductive portion 32, so that the electrostatic protective layer 7 is grounded.

Figure 7:
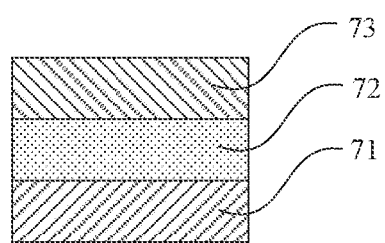
FIG. 7 is a diagram showing a structure of an electrostatic protective layer, in accordance with some embodiments.

For example, as shown in FIG. 7, the electrostatic protective layer 7 may include a mesh adhesive layer 71, a foam layer 72 and a copper layer 73 that are located on the back surface of the display panel 1 and are sequentially away from the display panel 1. The electrostatic protective layer 7 may dissipate heat of the display panel 1, and it is conducive to remove static electricity on the display panel 1.

The electrostatic protective layer 7 is electrically connected to the second conductive portion 32. The copper layer 73 in the electrostatic protective layer 7 may be electrically connected to the second conductive portion 32 of the flexible circuit board 3, so that the copper layer 73 in the electrostatic protective layer 7 is connected to the ground terminal of the flexible circuit board 3. Therefore, the antistatic capability of the overall display module 100 may be improved.

For example, the second conductive portion 32 of the flexible circuit board 3 may be connected to the electrostatic protective layer 7 through a second conductive adhesive 82.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display module, comprising:
   a display panel;
   a flexible circuit board bonded to the display panel;
   a driving control chip located on the display panel or the flexible circuit board;
   a touch control chip located on the flexible circuit board or the display panel; and
   a protective structure located on and covering the driving control chip and/or the touch control chip, wherein the protective structure includes a first insulating layer, a heat dissipation layer and an electromagnetic shielding layer that are sequentially disposed away from the display panel.

2. The display module according to claim 1, wherein the protective structure further includes:
   a wave-absorbing material layer located between the first insulating layer and the heat dissipation layer, the wave-absorbing material layer at least covering the driving control chip and/or the touch control chip; and
   a second insulating layer located between the wave-absorbing material layer and the heat dissipation layer.

3. The display module according to claim 2, wherein an edge of the second insulating layer is connected to an edge of the first insulating layer, so that the wave-absorbing material layer is sealed between the first insulating layer and the second insulating layer.

4. The display module according to claim 2, wherein the wave-absorbing material layer includes ferrite or a magnetic iron nanomaterial.

5. The display module according to claim 1, wherein the flexible circuit board includes a first conductive portion, and the electromagnetic shielding layer is electrically connected to the first conductive portion so that the electromagnetic shielding layer is grounded.

6. The display module according to claim 5, wherein the electromagnetic shielding layer is electrically connected to the first conductive portion through a first conductive adhesive, so that the electromagnetic shielding layer is grounded.

7. The display module according to claim 1, wherein the protective structure includes a whole protective structure covering the driving control chip and the touch control chip.

8. The display module according to claim 1, wherein the protective structure includes two protective sub-structures, a protective sub-structure covers the driving control chip, and another protective sub-structure covers the touch control chip.

9. The display module according to claim 8, wherein the two protective sub-structures share the first insulating layer and the electromagnetic shielding layer.

10. The display module according to claim 1, wherein the display panel is a flexible display panel, the flexible display panel includes a display region and a peripheral region connected to at least one side of the display region, and the peripheral region is bent to a non-display side of the display region;
- the flexible circuit board is located on the non-display side of the display region, and bonded to the peripheral region; and the touch control chip is located on a surface of the flexible circuit board away from the display region; and
- the driving control chip is located on a surface of the peripheral region away from the display region.

11. The display module according to claim 10, further comprising:
- at least one connecting portion located between the display region and the flexible circuit board, the at least one connecting portion being configured to fix the flexible circuit board on the display region.

12. The display module according to claim 11, further comprising:
- a protective backing plate located between the display region and the peripheral region.

13. The display module according to claim 12, further comprising:
- an electrostatic protective layer located on the non-display side of the display panel, wherein the flexible circuit board further includes a second conductive portion, and the electrostatic protective layer is electrically connected to the second conductive portion so that the electrostatic protective layer is grounded; and
- the at least one connecting portion is located on a side of the electrostatic protective layer away from the display panel, and the second conductive portion is located on a periphery of the at least one connecting portion.

14. The display module according to claim 13, wherein the electrostatic protective layer is electrically connected to the second conductive portion through a second conductive adhesive, so that the electrostatic protective layer is grounded.

15. The display module according to claim 13, wherein the electrostatic protective layer includes a mesh adhesive layer, a foam layer and a copper layer that are sequentially disposed away from the display panel, and the copper layer is electrically connected to the second conductive portion.

16. The display module according to claim 1, wherein the heat dissipation layer includes a nano-carbon layer; and/or
- the electromagnetic shielding layer includes a copper foil layer.

17. A display device, comprising:
- the display module according to claim 1; and
- a protective cover plate disposed on a display side of the display module.

* * * * *